United States Patent
Rhodes

(10) Patent No.: US 7,675,094 B2
(45) Date of Patent: Mar. 9, 2010

(54) IMAGE SENSOR PIXEL HAVING A TRANSFER GATE FORMED FROM P+ OR N+ DOPED POLYSILICON

(75) Inventor: Howard E. Rhodes, Boise, ID (US)

(73) Assignee: OmniVision Technologies, Inc., Santa Clara, CA (US)

( * ) Notice: Subject to any disclaimer, the term of this patent is extended or adjusted under 35 U.S.C. 154(b) by 726 days.

(21) Appl. No.: 11/021,134

(22) Filed: Dec. 22, 2004

(65) Prior Publication Data

US 2006/0131592 A1    Jun. 22, 2006

(51) Int. Cl.
    *H01L 27/148* (2006.01)
(52) U.S. Cl. ............... 257/232; 257/233; 257/E21.133
(58) Field of Classification Search .......... 257/222, 257/225, 232–234, 440, E31.084, E27.153, 257/E27.154, E27.163, E27.132, E27.133, 257/E31.064
    See application file for complete search history.

(56) References Cited

U.S. PATENT DOCUMENTS

| | | | |
|---|---|---|---|
| 4,027,380 A * | 6/1977 | Deal et al. | 438/227 |
| 5,396,096 A | 3/1995 | Akamatsu et al. | |
| 6,027,978 A | 2/2000 | Gardner et al. | |
| 6,165,902 A * | 12/2000 | Pramanick et al. | 438/653 |
| 6,166,846 A * | 12/2000 | Maloney | 359/247 |
| 6,218,691 B1 * | 4/2001 | Chung et al. | 257/290 |
| 6,310,366 B1 * | 10/2001 | Rhodes et al. | 257/185 |
| 6,657,665 B1 | 12/2003 | Guidash | |
| 2004/0217426 A1 * | 11/2004 | Lee | 257/369 |

FOREIGN PATENT DOCUMENTS

| | | |
|---|---|---|
| CN | 1286495 | 3/2001 |
| EP | 1 642 340 A0 | 4/2006 |
| JP | 64-027261 | 1/1989 |
| WO | WO 03/044855 A2 | 5/2003 |
| WO | WO 2004/044989 A1 | 5/2004 |

OTHER PUBLICATIONS

European Search Report, European Application No. 05257094, dated Jan. 14, 2009.

* cited by examiner

*Primary Examiner*—Brook Kebede
(74) *Attorney, Agent, or Firm*—Blakely Sokoloff Taylor & Zafman LLP

(57) ABSTRACT

An active pixel using a transfer gate that has a polysilicon gate doped with P+ is disclosed. The pixel includes a photosensitive element formed in a semiconductor substrate and an n-type floating node formed in the semiconductor substrate. An n-channel transfer transistor having a transfer gate is formed between the floating node and the photosensitive element. The transfer gate is doped with a p-type dopant.

15 Claims, 2 Drawing Sheets

IMAGE SENSOR PIXEL HAVING A TRANSFER GATE FORMED FROM P+ OR N+ DOPED POLYSILICON

TECHNICAL FIELD

The present invention relates to image sensors, and more particularly, to an image sensor that uses pixels with a transfer gate that is formed from P+ doped polysilicon.

BACKGROUND

Image sensors have become ubiquitous. They are widely used in digital still cameras, cellular phones, security cameras, medical, automobile, and other applications. The technology used to manufacture image sensors, and in particular CMOS image sensors, has continued to advance at great pace. For example, the demands of higher resolution and lower power consumption have encouraged the further miniaturization and integration of the image sensor.

Typically each pixel of an image sensor includes a photosensitive element, such as a photodiode, and one or more transistors for reading out the signal from the photosensitive element. With greater integration, the transistors are generally made smaller. For example, a transfer transistor is commonly used in a pixel using a four-transistor design. The transfer transistor has a transfer gate formed between the photosensitive element and a floating node. The transfer gate is an important element in the pixel and it is desirable to scale the transfer gate to have a shorter gate length for reasons of greater integration and enhanced pixel fill factor.

However, short gate lengths may result in leakage current from the photosensitive element to the floating node. One method of dealing with this leakage current is to increase the enhancement implant under the transfer gate. This increases the barrier/well potentials at the transfer gate and photodiode interface. The increase of the barrier/well potentials will also degrade image sensor performance by increasing image lag.

DETAILED DESCRIPTION

In the following description, numerous specific details are provided in order to give a thorough understanding of embodiments of the invention. One skilled in the relevant art will recognize, however, that the invention may be practiced without one or more of the specific details, or with other methods, components, materials, etc. In other instances, well known structures, materials, or operations are not shown or described in order to avoid obscuring aspects of the invention.

Referenced throughout the specification to "one embodiment" or "an embodiment" means that a particular feature, structure, or characteristic described in connection with the embodiment and included in at least one embodiment of the present invention. Thus, the appearances of the phrase "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
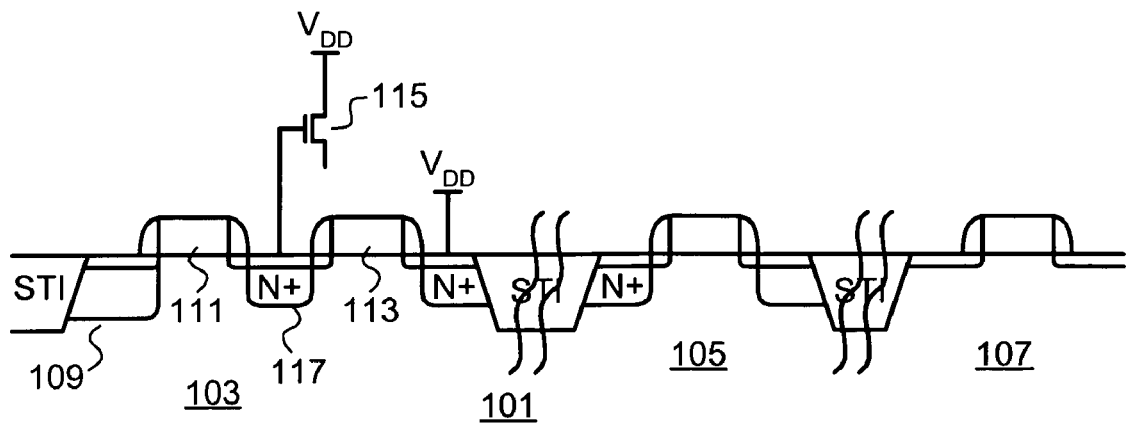
FIG. 1 is a cross-sectional view of a prior art four transistor (4T) pixel as well as the peripheral p-channel and n-channel transistors.

FIG. 1 shows a combination cross-sectional view of a prior art image sensor and active pixel that uses four transistors. This is known in the art as a 4T active pixel. However, it can be appreciated that the photodiode design of the present invention can be used with any type of pixel design, including but not limited to 5T, 6T, and other designs.

As seen in FIG. 1, a portion 101 of an image sensor is shown. The portion 101 of the image sensor includes a pixel 103, an n-channel periphery area 105, and a p-channel periphery area 107. The n-channel periphery area 105 and p-channel periphery area 107 contains those elements of the image sensor outside of the pixel array. The transistors shown in areas 105 and 107 of course are merely exemplar and these areas would normally contain many transistors (PMOS and NMOS).

The pixel 103 is only one exemplar pixel in the pixel array. The pixel includes a photosensitive element 109, which in this embodiment is a pinned photodiode. However, the photosensitive element may be a photogate, photocapacitor, partially pinned photodiode, or unpinned photodiode.

The photodiode 109, outputs a signal that is used to modulate an amplification transistor 115. The amplification transistor 115 is also referred to as a source follower transistor. A transfer transistor having a transfer gate 111 is used to transfer the signal output by the photodiode 109 to a floating node 117 (N+ doped) and the gate of the amplification transistor 115.

In operation, during an integration period (also referred to as an exposure or accumulation period), the photodiode 109 generates charge (in response to incident light) that is held in the N⁻ layer of the photodiode 109. After the integration period, the transfer gate 111 is turned on to transfer the charge held in the N⁻ layer to the floating node 117. After the signal has been transferred to the floating node 117, the transfer gate 117 is turned off again for the start of a subsequent integration period. The signal on the floating node 117 is then used to modulate the amplification transistor 115. After readout, a reset transistor having a reset gate 113 resets the floating node 117 to a reference voltage. In one embodiment, the reference voltage is $V_{dd}$.

However, as noted above, as the transfer gate 111 decreases in size due to integration and fill factor demands, the occurrence of leakage current from the photodiode 109 to the floating node 117 increases. The present invention acts to reduce transfer gate leakage current without the loss of image sensor performance and with minimal increased processing/manufacturing complexity.

In that regard, the N+ regions for the floating node 117 and the connection to the reset reference voltage $V_{dd}$ are formed using a masking and implanting process. The same masking and implanting process (typically using arsenic and/or phosphorus) is used to form N+ regions for the NMOS transistors in the n-channel periphery area 105. The N+ implant process also implants N+ dopants into the polysilicon gates of the NMOS transistors in the n-channel periphery area 105, as well as the reset gate. Note that advanced CMOS image sensors typically will include a surface p-channel process flow where the polysilicon gate material is implanted. Typically, the n-channel gates are implanted with an N+ dopant and the p-channel gates are implanted with P+. These implants are chosen to achieve low threshold voltage ($V_t$) n-channel and p-channel transistors. Further, there is typically also a buried p-channel process where the n-channel and p-channel polysilicon gates are all doped the same. Typically, this is N+ doped, either by implantation or preferably by the deposition of insitu N+ doped polysilicon using a phosphorus or arsenic containing source.

Figure 2:
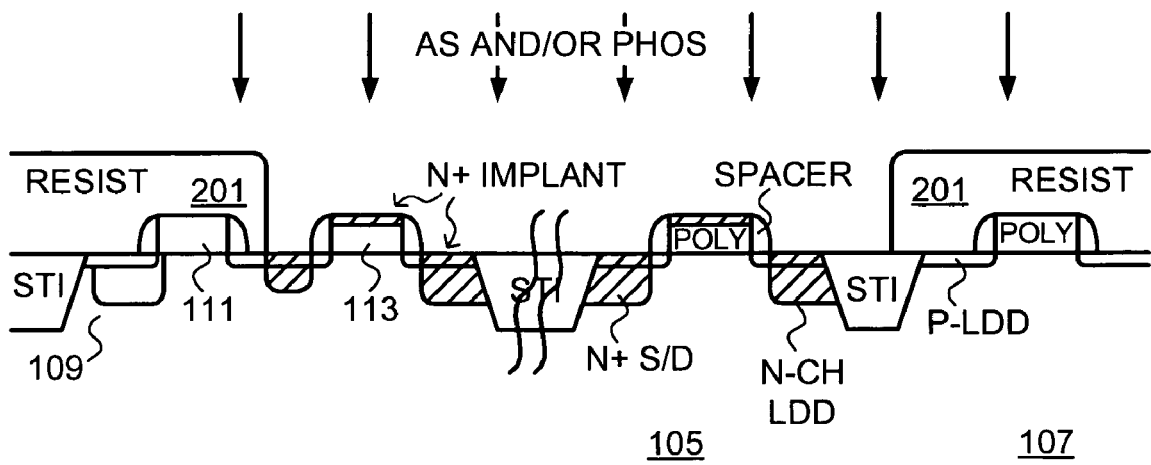
FIGS. 2-3 are cross-sectional diagrams showing a method of making a pixel in accordance with the present invention.

As seen in FIG. 2 of the present invention, a photoresist mask 201 is used for the N+ implant that protects the transfer gate 111 from exposure to the N+ implant. In the prior art, the transfer gate 111 was also implanted with the conventional N+ doping applied to the n-channel NMOS transistors.

Figure 3:
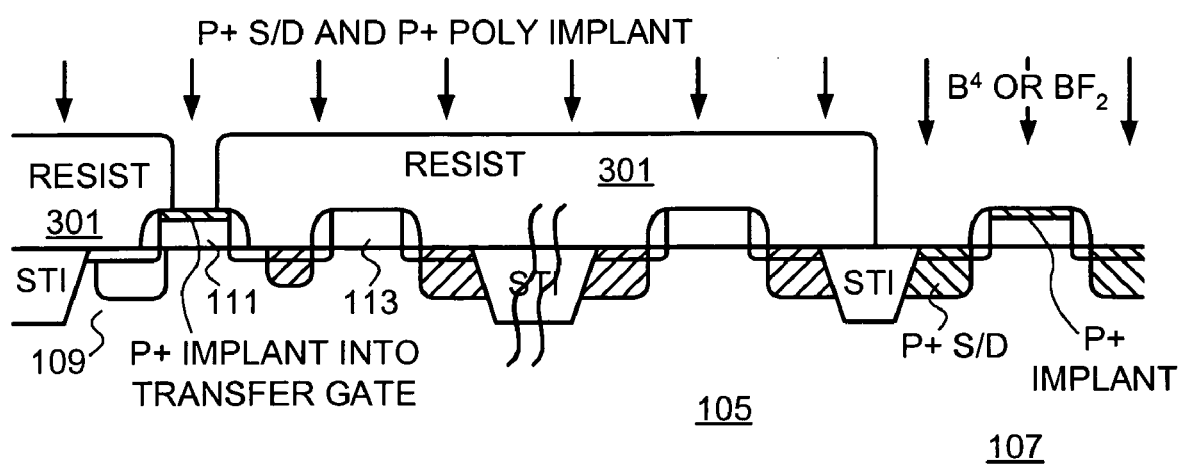

In accordance with the present invention, turning to FIG. 3, a second photoresist mask 301 is formed. The second photoresist mask 301 in general leaves exposed the PMOS transistors in the p-channel periphery area 107 and the transfer gate 111. Thus, as seen in FIG. 3, during the implantation of the P+ dopants, the polysilicon of the transfer gate 111 is also implanted with P+ dopants. This creates a transfer gate 111 that has a relatively high threshold voltage ($V_t$) because of the work function change of the P+ doped transfer gate 111.

The dopant may be for example boron or $BF_2$. In one embodiment, boron is implanted using 500 eV-20 KeV, and preferably between 2 KeV-10 KeV of energy and a dopant concentration of 5e14 ions/cm$^2$ to 5e16 ions/cm$^2$, and more preferably 1e15 ions/cm$^2$ to 1e16 ions/cm$^2$. However, it can be appreciated that other implant energies and dopant concentrations may also be used, depending upon specific desired device characteristics and other design considerations.

Additionally, the P+ doping may be done during an insitu doping process where the polysilicon layer that forms the transfer gate is formed in the presence of a boron containing substance, such as $B_2H_6$ or $BCl_3$.

It is important to note that the process described above does not include any additional steps, but merely the adjusting of the pattern of the photoresist mask 301 for the p-channel PMOS transistor implant. As such, there is little additional complexity in implementing the present invention. Further, the leakage current ($I_{off}$) is greatly improved allowing the transfer gate 111 to be scaled to shorter gate lengths. Moreover, with a higher threshold voltage ($V_t$) for the transfer gate 111, the enhancement implant for the photodiode 109 and transfer transistor regions can now be reduced to provide even further improvement in the barrier/well potential at the photodiode 109 and transfer gate 111 interface.

While the present invention has been described in the context of an n-channel transfer transistor, the same concept can be applied to a p-channel transfer transistor. Thus, the p-channel transfer transistor would have its transfer gate doped with an N+ implant. The dopant may be for example arsenic or phosphorus. In one embodiment, arsenic or phosphorus is implanted using 1 KeV-200 KeV, and preferably between 5 KeV-50 KeV of energy and a dopant concentration of 5e14 ions/cm$^2$ to 5e16 ions/cm$^2$, and more preferably 1e15 ions/cm$^2$ to 1e16 ions/cm$^2$. However, it can be appreciated that other implant energies and dopant concentrations may also be used, depending upon specific desired device characteristics and other design considerations.

Alternatively, the N+ doping may be done during an insitu doping process where the polysilicon layer that forms the transfer gate is formed in the presence of a n-type dopant, such as $P_2H_6$ or $POCl_3$ or arsine.

Further, although the present invention has been discussed in the context of an image sensor transfer transistor, the present invention may also be applied to any CMOS transistor where leakage current is an issue.

Thus, from the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A pixel comprising:
    a photosensitive element formed in a semiconductor substrate;
    an n-type floating node formed in said semiconductor substrate; and
    an n-channel transfer transistor having a transfer gate between said floating node and said photosensitive element, said transfer gate doped with a p-type dopant and not doped with an n-type dopant, wherein said transfer gate is doped to increase a threshold voltage of said transfer transistor to reduce a transfer gate leakage current from said photosensitive element to said floating node.

2. The pixel of claim 1 wherein said photosensitive element is a photodiode, partially pinned photodiode, pinned photodiode, photogate, or photocapacitor.

3. The pixel of claim 1 wherein said transfer gate is P+ doped to a dosage of between 5e14 ions/cm$^2$ to 5e16 ions/cm$^2$.

4. The pixel of claim 1 further including an amplification transistor controlled by said floating node.

5. The pixel of claim 1 further including a reset transistor operative to reset said floating node to a reference voltage.

6. The pixel of claim 1 wherein said pixel is a part of a 4T, 5T, 6T, or 7T architecture.

7. The pixel of claim 1 wherein said transfer gate is P+ doped using an implant energy of between 500 eV to 20 keV.

8. The pixel of claim 1 wherein said transfer gate is P+ doped using an insitu process during formation of said transfer gate.

9. A pixel comprising:
    a photosensitive element formed in a semiconductor substrate;
    a floating node formed in said semiconductor substrate, wherein said floating node is of a first conductivity type; and
    a transfer transistor of the first conductivity type, said transfer transistor having a transfer gate between said floating node and said photosensitive element, said transfer gate doped with a second conductivity type and not doped with the first conductivity type, wherein said transfer gate is doped to increase a threshold voltage of said transfer transistor to reduce a transfer gate leakage current from said photosensitive element to said floating node.

10. The pixel of claim 9, wherein said photosensitive element is a photodiode, partially pinned photodiode, pinned photodiode, photogate, or photocapacitor.

11. The pixel of claim 9, further including an amplification transistor controlled by said floating node.

12. The pixel of claim 9, further including a reset transistor to reset said floating node to a reference voltage.

13. The pixel of claim 9, wherein said pixel is a part of a 4T, 5T, 6T, or 7T architecture.

14. The pixel of claim 9, wherein the first conductivity type is n-type and the second conductivity type is p-type.

15. The pixel of claim 14, wherein the transfer gate is P+ doped to a dosage of between 5e14 ions/cm$^2$ to 5e16 ions/cm$^2$.

* * * * *